United States Patent [19]
Choi et al.

[11] Patent Number: 6,012,122
[45] Date of Patent: Jan. 4, 2000

[54] SYSTEMS AND METHODS FOR DISTINGUISHING BETWEEN MEMORY TYPES

[75] Inventors: Do-Chan Choi, Seoul; Tae-Sung Jung; Oh-Seung Kwon, both of Kyungki-do, all of Rep. of Korea

[73] Assignee: Samsung Electronics Co., Ltd., Rep. of Korea

[21] Appl. No.: 08/769,588

[22] Filed: Dec. 18, 1996

[30] Foreign Application Priority Data

Dec. 20, 1995 [KR] Rep. of Korea ......... 95/52595

[51] Int. Cl.[7] .................................. G06F 12/00
[52] U.S. Cl. .............. 711/105; 711/170; 714/718; 714/719; 365/201
[58] Field of Search ..................... 711/105, 170; 714/718, 719; 365/201

[56] References Cited

U.S. PATENT DOCUMENTS

| | | | |
|---|---|---|---|
| 5,175,835 | 12/1992 | Beighe et al. | 711/212 |
| 5,568,651 | 10/1996 | Medina et al. | 395/894 |
| 5,701,438 | 12/1997 | Bains | 711/211 |
| 5,708,791 | 1/1998 | Davis | 711/105 |

OTHER PUBLICATIONS

Intel 82430FX PCIset Datasheet 82437FX System Controller (TSC) and 82438FX Data Path Unit (TDP), Dec. 1996.
Intel 82430FX PCIset Datasheet 82437FX System Controller (TSC) and 82438FX Data Path Unit (TDP), Jun. 1996.
"Reduced DRAM Cycle Times With Extended Data–Out", Micron, pp. 6–37–6–43, Mar. 1993.
"EDO Compatibility With FPM DRAMs", Micron, pp. 1–4, Dec, 1995.
Maximizing DRAM Valid Data–Out Window, Micron pp. 1–4, Feb. 1996.

*Primary Examiner*—Jack A. Lane
*Attorney, Agent, or Firm*—Myers Bigel Sibley & Sajovec

[57] ABSTRACT

A plurality of memory types are distinguished from one another in memory systems containing a plurality of memory types by applying an input signal to the memory system containing the plurality of memory types and detecting differing outputs from the plurality of memory types during a predetermined time period after the input signal is applied. Extended data output (EDO), dynamic random access memories (DRAM) are thereby distinguished from fast page mode (F/P) DRAM. Similarly, nonvolatile memory such as DRAM interface flash memory (DIFM) are distinguished from conventional DRAMs.

24 Claims, 8 Drawing Sheets

SYSTEMS AND METHODS FOR DISTINGUISHING BETWEEN MEMORY TYPES

FIELD OF THE INVENTION

This invention relates to information processing systems and methods, and more particularly to memory systems and methods.

BACKGROUND OF THE INVENTION

Memory systems are widely used in information processing systems to store data. Memory systems may be generally classified as solid state memory systems or moving memory systems. Solid state memory systems generally include various types of integrated circuit devices with arrays of memory cells thereon, such as static random access memory (SRAM) and dynamic random access memory (DRAM). Moving memory systems include floppy disk, hard disk and CD-ROM.

In the personal computer industry, multiple integrated circuit memory devices are often packaged together on a printed circuit board or card to form a memory module. Memory modules may be connected to several slots within a computer system.

Figure 1:
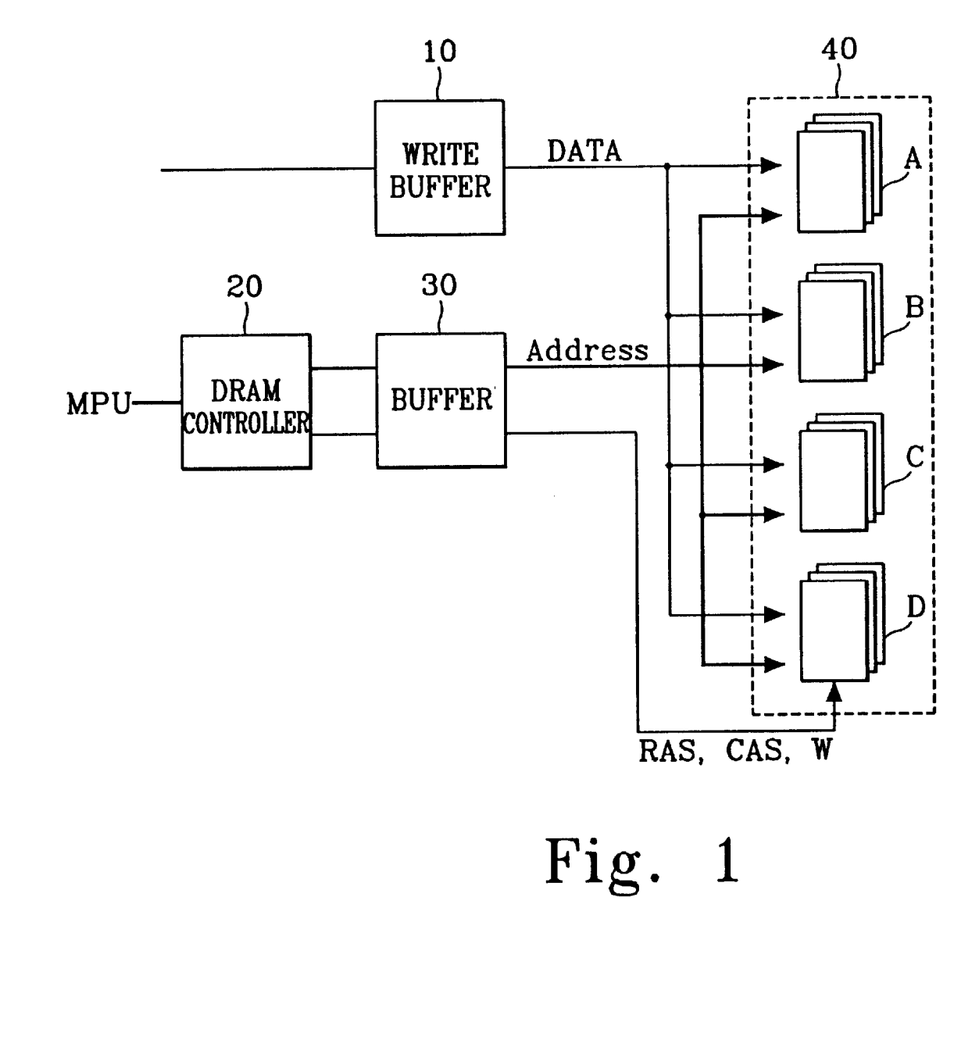
FIG. 1 illustrates a block diagram of a conventional memory system.

FIG. 1 is a block diagram which illustrates a dynamic random access memory (DRAM) system and conventional peripheral circuits which control the DRAM system. As shown in FIG. 1, there are four slots designated A, B, C, D. A conventional DRAM controller 20, buffer 30 and write buffer 10 are also included. Memory modules which include DRAMs of the same type are used in each of the four slots A, B, C, D. For example, if extended data output (EDO) DRAMs are used, they are generally used in all four slots. If different DRAM modules, such as fast page (F/P) DRAMs are used, the DRAM controller 20 may not be able to distinguish from one another. Thus, the same operating signal may be sent to each of the modules that are connected to the slots. As such, the DRAM modules with different types may not operate.

Moreover, even if the modules having different types of DRAMs can operate in response to the same output signal which is generated by the DRAM controller 20, the different types of DRAM may not operate in an optimum manner. Thus, the DRAM controller may detect that the modules 40 are reading and writing data, and may thereby determine the amount of memory which the DRAM controller is controlling. However, the controller may not be able to optimize operation for each of the plurality of memory types.

SUMMARY OF THE INVENTION

The present invention includes systems and methods which distinguish a plurality of memory types from one another in a memory system containing the plurality of memory types. Thus, different memory types may be detected so that dissimilar memory types can be used in a single memory system. Moreover, the dissimilar memory types can be controlled by appropriate operating signals to optimize the performance for each type of device.

In particular, a plurality of memory types are distinguished by applying an input signal to the plurality of memory types and detecting differing output from the plurality of memory types during a predetermined time period after the input signal is applied. The plurality of memory types are then controlled differently based upon the differing outputs which are detected from the plurality of memory types during the predetermined time period after the input signal is applied.

In one embodiment of the present invention, the plurality of memory types comprise extended data output (EDO) dynamic random access memories (DRAM) and fast page mode (F/P) DRAM. An input signal is applied to both memory types by applying a column address signal to the EDO DRAM and to the F/P DRAM. The differing outputs are detected by detecting data from the EDO DRAM and detecting a high impedance from the F/P DRAM during the predetermined time period after the column address signal is applied.

In another embodiment according to the invention, the plurality of memory types include refreshed DRAM and nonvolatile memory such as a DRAM-interfaced flash memory (DIFM). Input signals are applied to the refreshed DRAM and the DIFM by applying a refresh signal to the refreshed DRAM and the DIFM. The differing outputs are detected by detecting data from the refresh DRAM and detecting absence of data from the DIFM during a predetermined time period after the refresh signal is applied. Alternatively, data is written into the refreshed DRAM and the DIFM. The differing outputs are detected by detecting the written data from the refreshed DRAM and detecting absence of the written data from the DIFM during a predetermined time period after the data is written.

The present invention may be applied to a plurality of different memory types which are contained in a single memory module and may also be applied a plurality of memory modules, each of which contains a different memory type. Multiple types of memory may thus be used, and improved performance may be obtained.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

According to the present invention, different memory types can be distinguished in a memory system so that mixed memory types can be used and preferably individually controlled to improve overall memory system operation. In a preferred embodiment, a DRAM-interfaced flash memory (DIFM) and a conventional DRAM are used together. The DRAM and the DIFM can be distinguished from one another so that optimal timing signals may be applied to each different memory type to enhance system performance.

DIFMs are well known to those having skill in the art and will not be described in detail herein. However, it should be noted that DIFMs can be compatible with DRAMs during data processing. Thus, when a DIFM module is installed in a computer system instead of a DRAM module, data processing is possible without requiring a secondary control device. However, DIFMs do not need to be electrically refreshed to avoid loss of data. This contrasts with DRAMs, which generally need to be electrically refreshed periodically to avoid loss of data. Finally, DIFMs include additional operating modes when writing data which are not present for conventional DRAMs. For example, page erase, block erase, chip erase and programmable modes are generally available for DIFMs but not generally available for DRAMs.

According to the present invention, when DRAM and DIFM devices are distinguished from one another, they can still operate using the same control signals during read mode. However, since refresh is not required for DIFM devices, unnecessary refreshes may be eliminated for the DIFM devices, to thereby speed up their operation. Moreover, additional modes may be provided for page erase, block erase, chip erase and other unique DIFM operations. System efficiency can therefore be enhanced.

Methods of distinguishing between extended data output (EDO) DRAM and fast page mode (F/P) DRAM according to the invention will first be described. Thereafter, methods of distinguishing between refreshed DRAM and DIFM will be described, according to the present invention.

Figure 2:
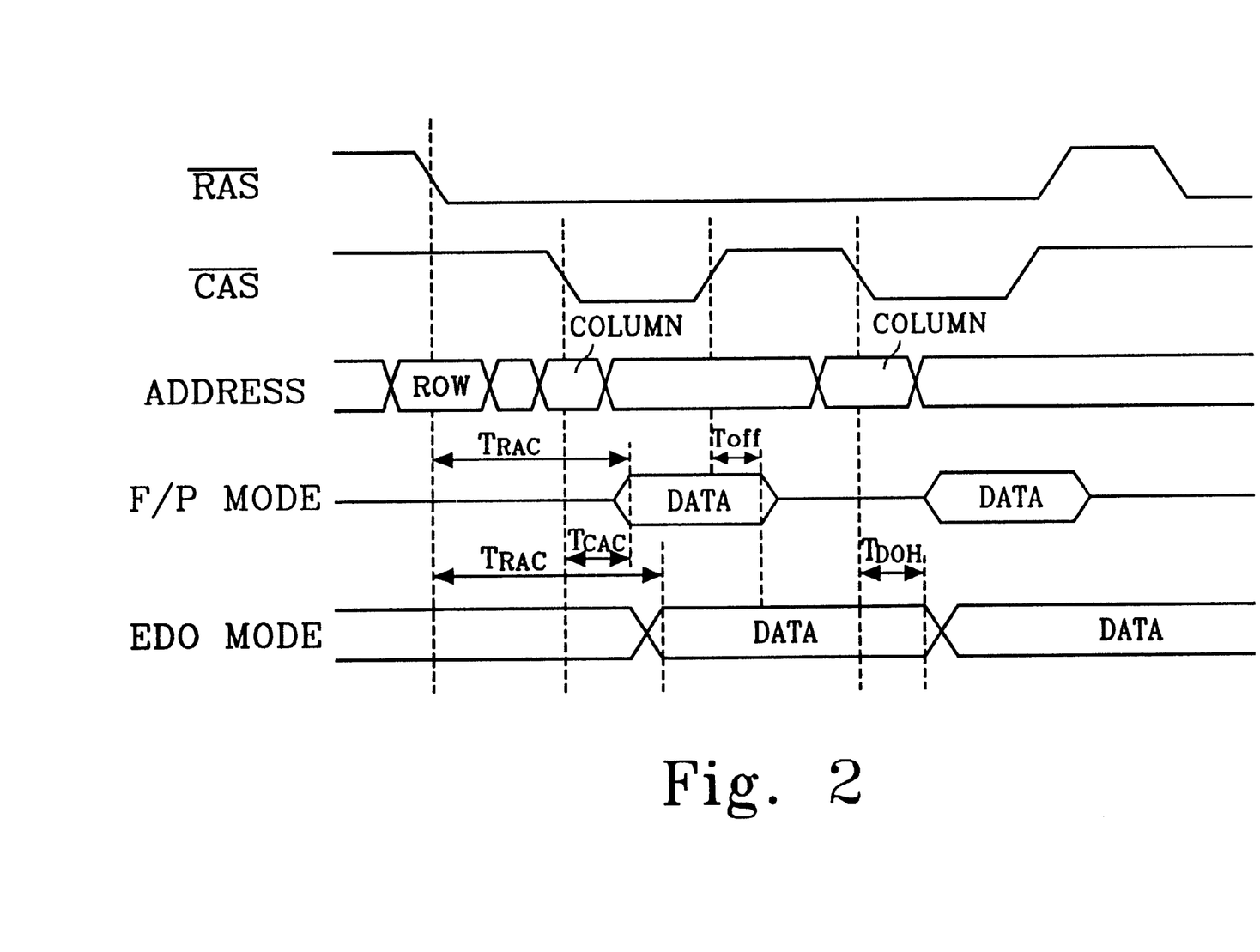
FIG. 2 is a timing chart of signals for a DRAM in F/P mode and EDO mode according to the present invention.

FIG. 2 is a timing diagram which illustrates systems and methods for distinguishing between F/P and EDO DRAMs according to the present invention. Many of the signals shown in FIG. 2 are commonly used in conventional DRAMs, such as row address strobe signal $\overline{RAS}$, column address signal $\overline{CAS}$ and output enable signal OE, and write enable signal $\overline{W}$, and will not be described in detail herein.

Still referring to FIG. 2, time $T_{off}$ indicates the time after which data in an F/P memory transitions to a high impedance state after the $\overline{CAS}$ signal transitions from low to high. In contrast, for a period $T_{DOH}$, the output data which was generated in a previous $\overline{CAS}$ period remains in the EDO mode after $\overline{CAS}$ returns to its low state. Accordingly, as shown in FIG. 2, a difference between F/P and EDO DRAMs is that the data output remains when the $\overline{CAS}$ signal transitions from a low to a high value in EDO mode devices, but the data output becomes a high impedance in F/P mode devices. Accordingly, since the data remains in EDO mode until data is output in the next cycle of $\overline{CAS}$, the time which is required to precharge by signal $\overline{CAS}$ can be saved compared to devices operating in F/P mode. It is also possible to further reduce the $\overline{CAS}$ cycle time of a DRAM in EDO mode compared to the DRAM in F/P mode, by an amount which is based on the time required to precharge the memory in response to the $\overline{CAS}$ signal.

According to the invention, even though all of the memory modules connected to the memory slots in the system are all DRAM types, it is determined whether each module is an EDO or an F/P DRAM prior to operation. Then, enhanced timing signals can be applied to the corresponding memory modules, to thereby increase data processing speed and increase system efficiency.

In particular, referring to FIG. 2, a row address and a column address, which are synchronized with $\overline{RAS}$ and $\overline{CAS}$, are decoded to produce data from the addressed memory cell, on a data output bus. When the voltage level in the data output bus is detected at a time $T_{off}$ after the $\overline{CAS}$ signal becomes high, the data output remains at a high or low voltage value for the EDO module. In contrast, an F/P module will transition to the high impedance state. Accordingly, F/P modules can be distinguished from EDO modules by detecting data from the EDO RAM and detecting a high impedance from the F/P DRAM during a predetermined time period after the column address signal is applied.

Systems and methods for distinguishing DIFM modules from conventional DRAM modules including EDO and F/P DRAMs will now be described. It will be understood that DIFM memories do not require refresh in order to avoid loss of data, because they are nonvolatile memories. According to the invention, if a refresh signal is applied to the refreshed DRAM and to the nonvolatile memory such as DIFM, the differing data produced by the DIFM device and a conventional DRAM device allows the DIFM memory to be identified. It will be understood that many types of refresh timing may be used, such as $\overline{CAS}$ before $\overline{RAS}$ timing (referred to herein as "CBR mode"), $\overline{CAS}$ before $\overline{RAS}$ self-refresh timing and hidden refresh timing.

Figure 3:
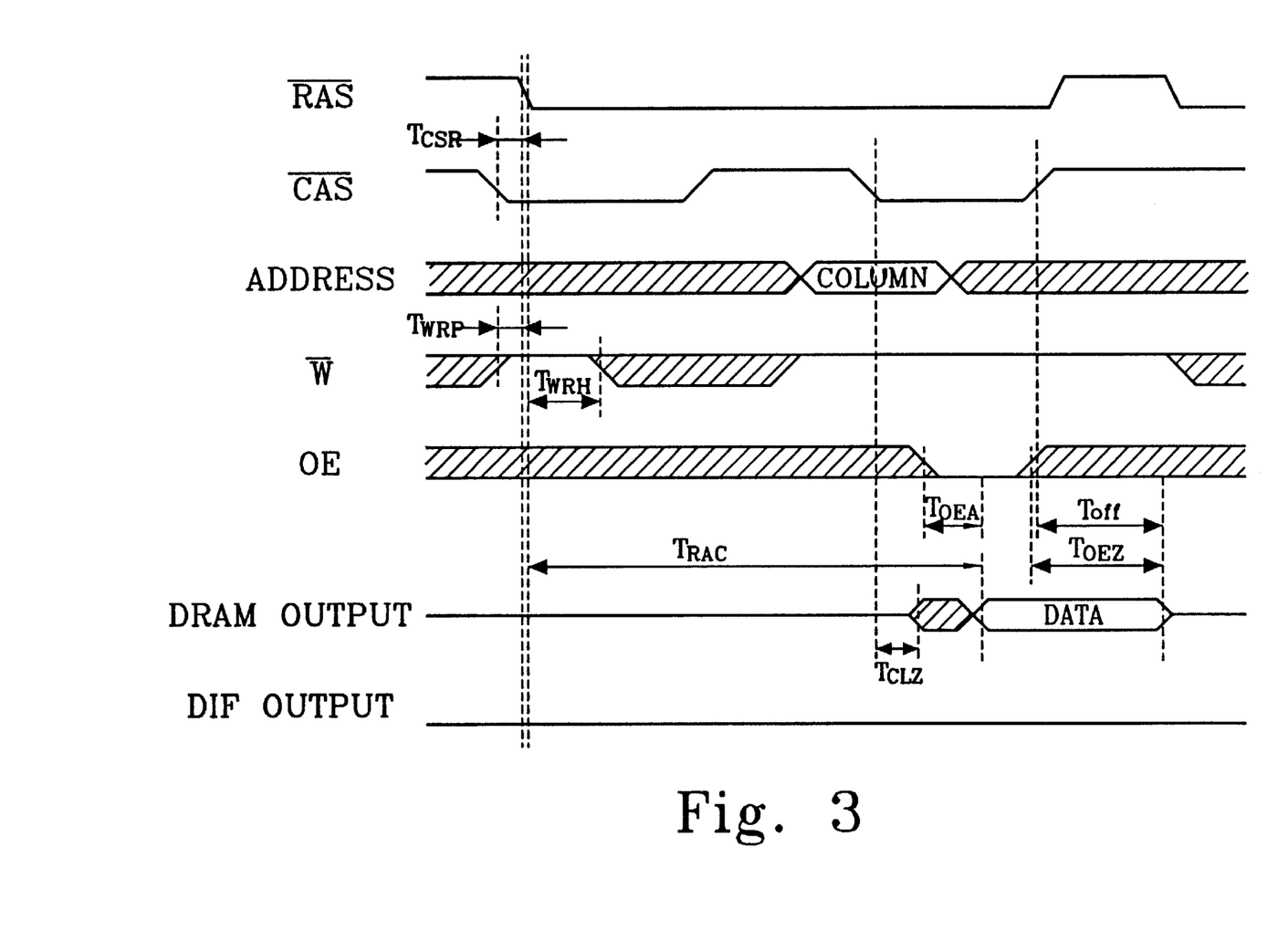
FIG. 3 is a timing diagram of signals of refreshed DRAM and DIFM according to the present invention.

A preferred embodiment for discriminating between DIFM and DRAM modules using CBR mode will now be described. FIG. 3 shows a timing chart of output signals of a DRAM and a DIFM in CBR timing mode. As already described, the DIFM device does not require refresh to avoid loss of data. Thus, if a DRAM module and a DIFM module are actuated by a single control signal in a system, when the system controller applies a CBR mode signal to the DIFM, the DIFM will respond differently than the DRAM to the refresh operation. In particular, it will not perform a refresh operation, so that power consumption can be reduced.

As shown in FIG. 3, after $\overline{CAS}$ goes high and a time $T_{RAC}$ elapses, a conventional DRAM will produce data, whereas the DIFM will not produce data. Accordingly, this difference may be monitored to thereby distinguish a DIFM from a DRAM during CBR counter-test timing.

Figure 4:
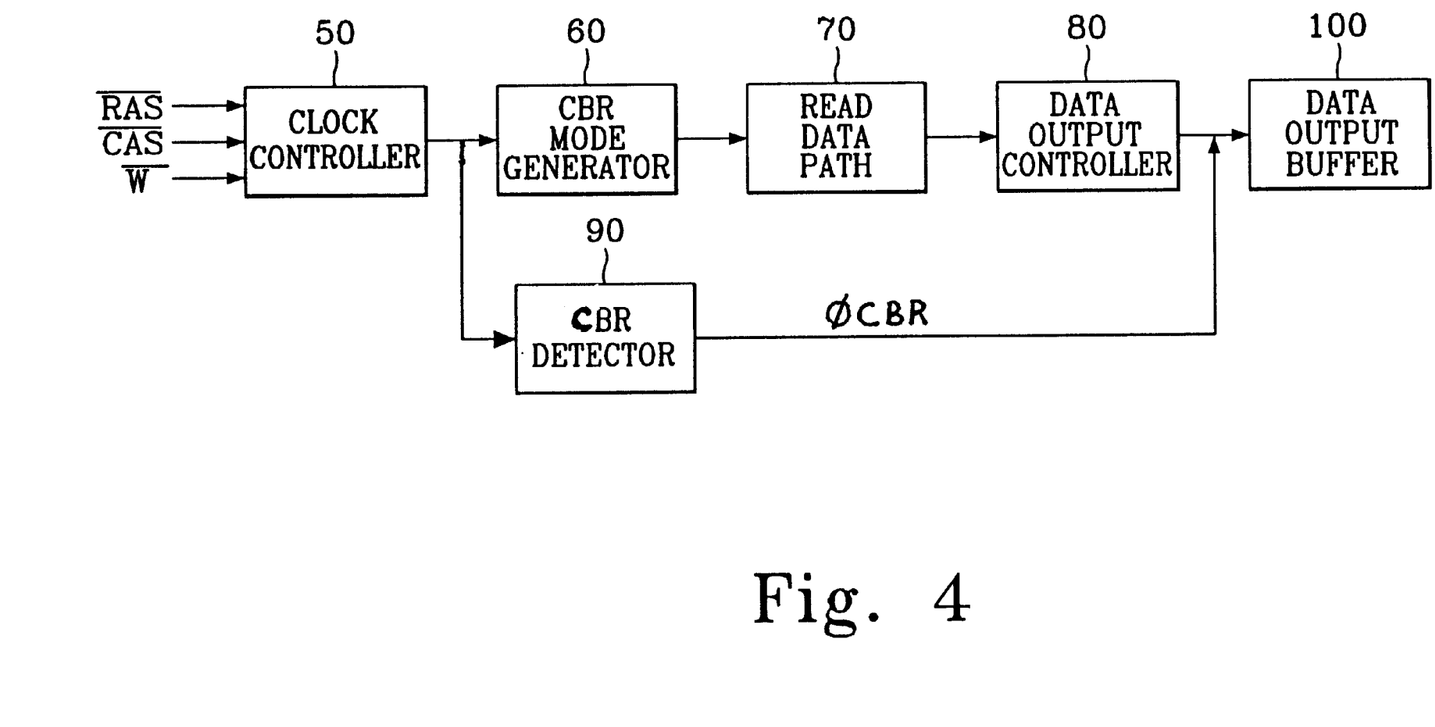
FIG. 4 is a block diagram of a controller which distinguishes between a plurality of memory types according to the present invention.

DRAM operation during CBR timing is well known to those having skill in the art and need not be described further. Systems and methods for preventing a DIFM memory from generating data when CBR signal is applied to DIFM modules will now be described. FIG. 4 is a block diagram of preferred systems and methods according to the present invention. As shown in FIG. 4, a clock controller 50 receives control signals $\overline{RAS}$, $\overline{CAS}$ and $\overline{W}$. A CBR mode generator 60, read data path 70 and data output controller 80 are also included. A CBR detector 90 senses that the signal $\overline{RAS}$ first becomes low before $\overline{CAS}$, and produces signal $\phi$CBR to control the data output buffer 100 so that the DIFM module does not output data in CBR mode.

Figure 5A:
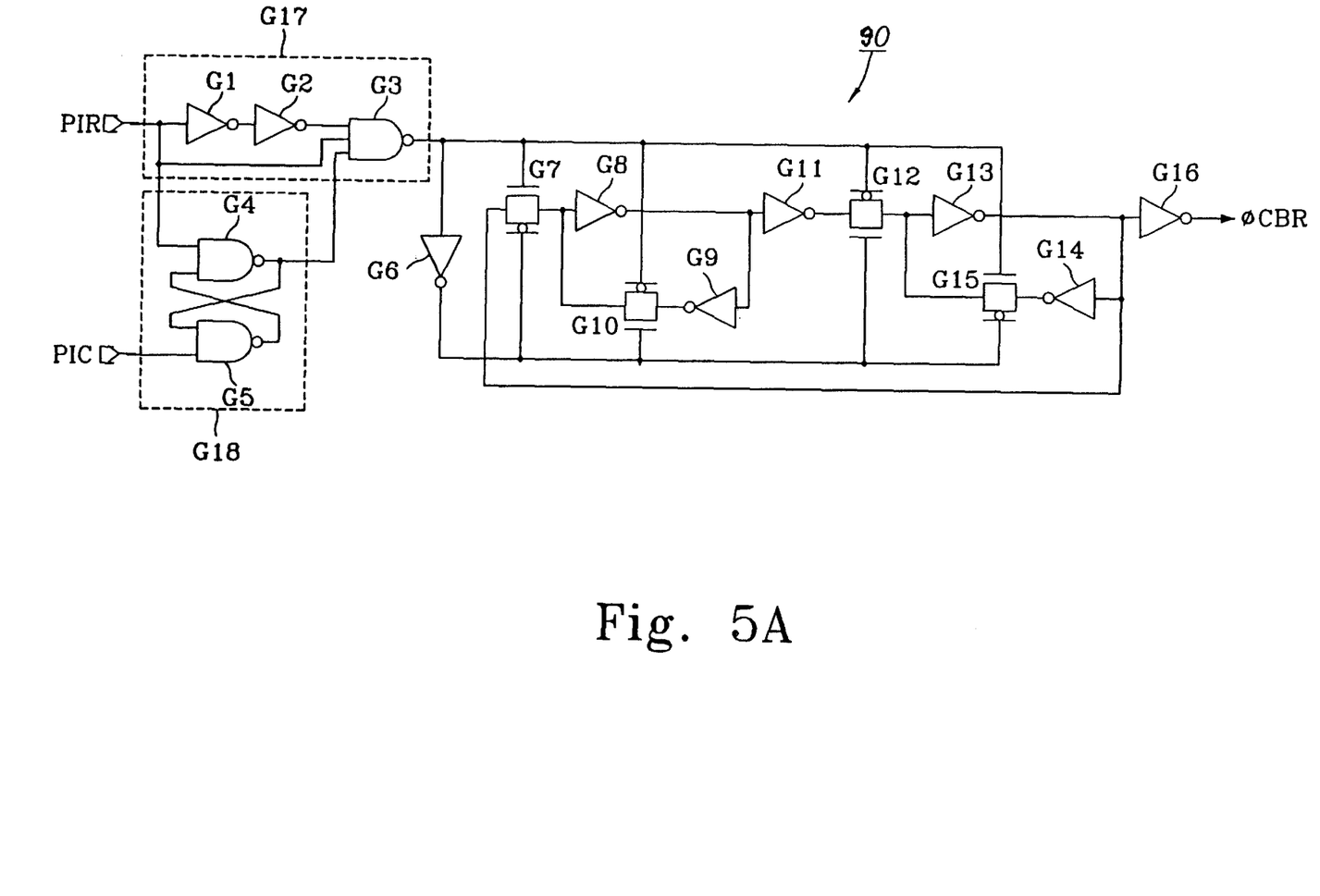
FIGS. 5A and 5B are detailed circuit embodiments of CBR detector and the data output buffer, respectively, of FIG. 4.
Figure 5B:
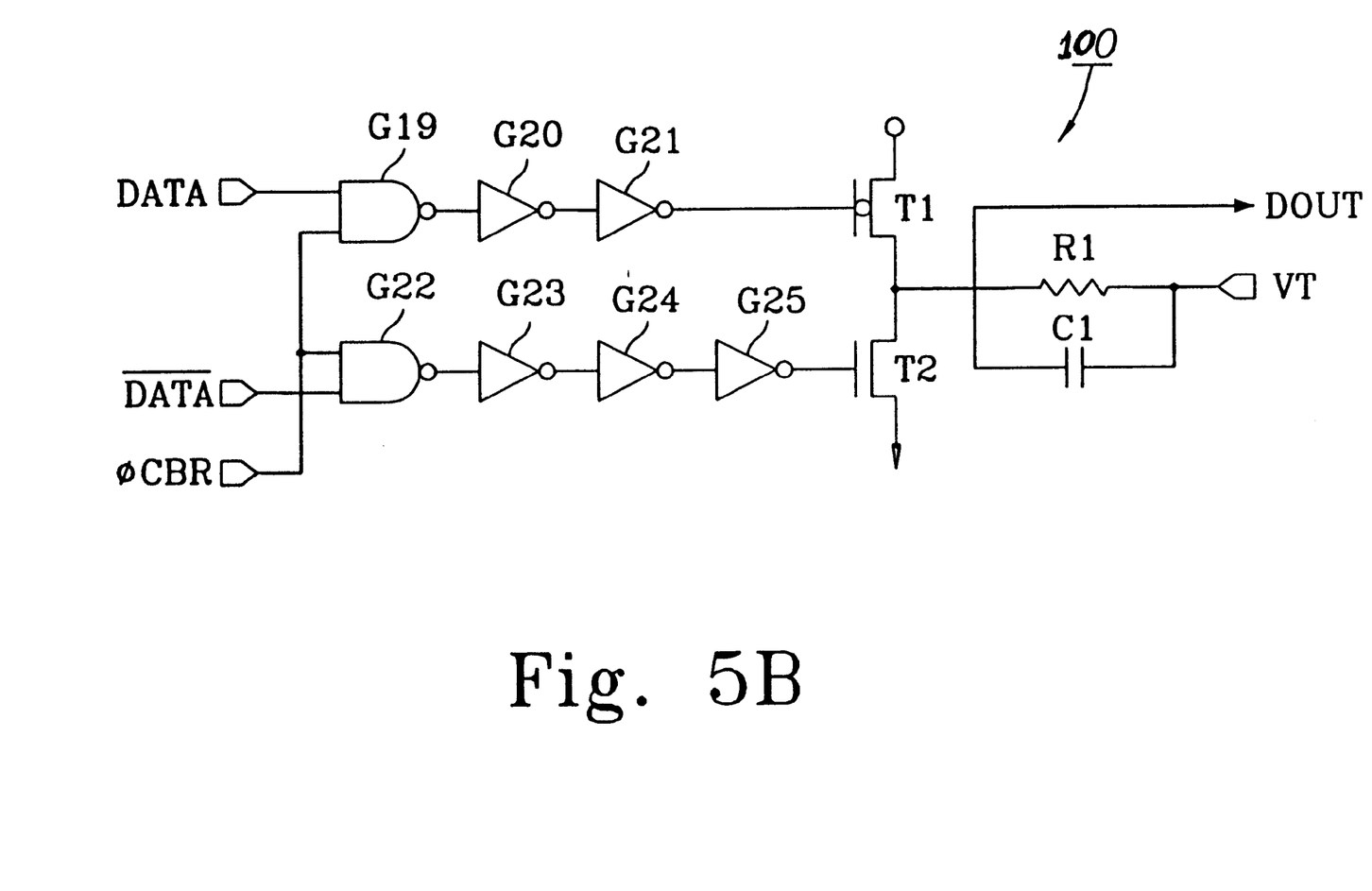
Figure 6:
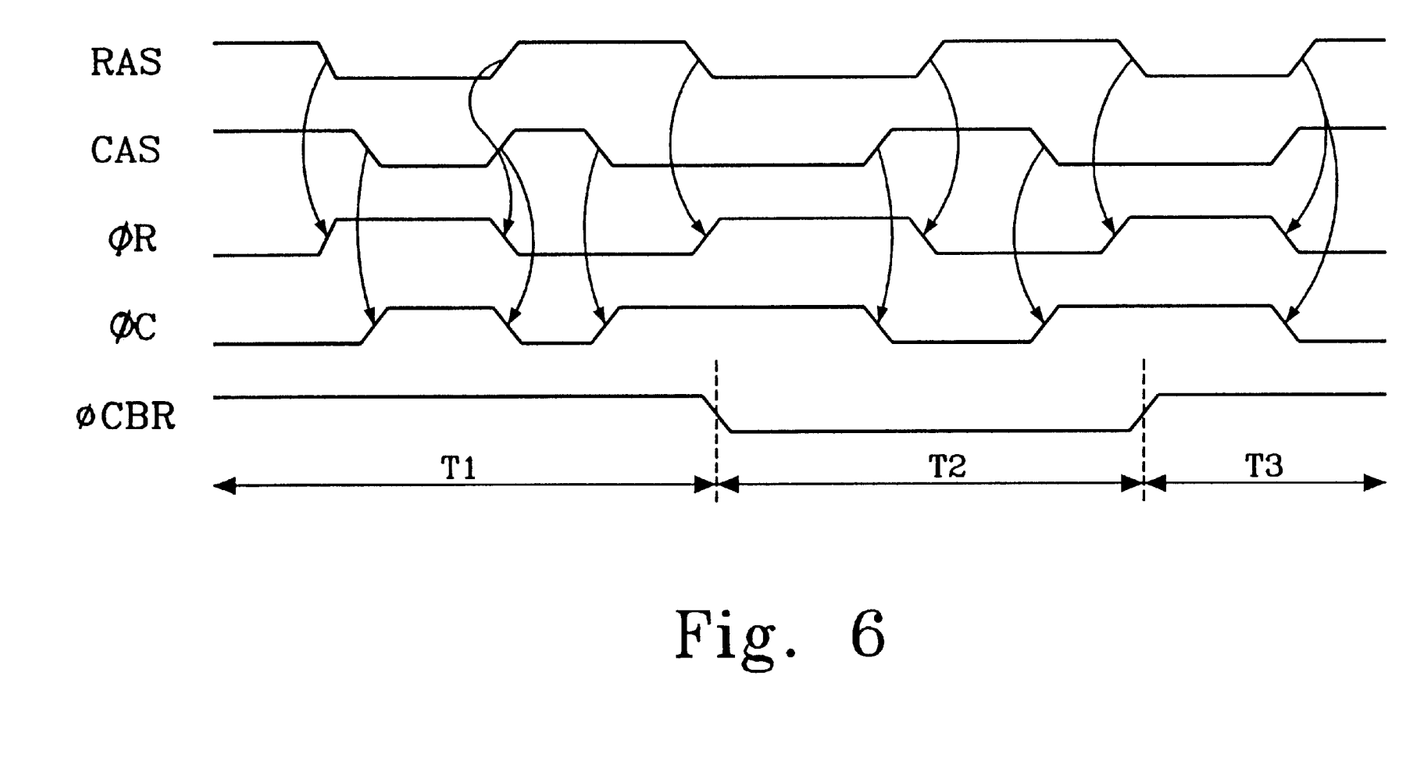
FIG. 6 is a timing chart of electrical signals produced by the circuits of FIGS. 5A and 5B.

FIG. 5A illustrates a detailed implementation of CBR detector 90. As shown in FIG. 5A, CBR mode generator 60 includes logic gates G1–G16. As shown in FIG. 6, CBR detector 90 detects the time interval $\phi$R between signals PIR produced by $\overline{RAS}$ and the interval $\phi$C between the PIC output signal produced by $\overline{CAS}$, to thereby determine operating mode. When the CBR detector 90 detects that $\phi$CBR mode has been established, the CBR detector 90 output $\phi$CBR is changed in phase during the period T2. If the output $\phi$CBR becomes low, the output data DOUT from data output buffer 100 remains at a high impedance state. As shown in FIG. 5B, data output buffer 100 includes logic gates G19–G25, transistors T1 and T2, resistor R1 and capacitor C1.

Thus, when the CBR signal is applied to a DIFM module, the DIFM module places its outputs in a high impedance state. Thus, when DRAM and DIFM modules coexist in the same system, DRAM modules and DIFM modules can be distinguished based on the outputs they generate after a signal of CBR timing is applied to data output buffer 100. The different memory types may be controlled differently based upon the differing outputs which are detected, to thereby improve system performance.

Figure 7:
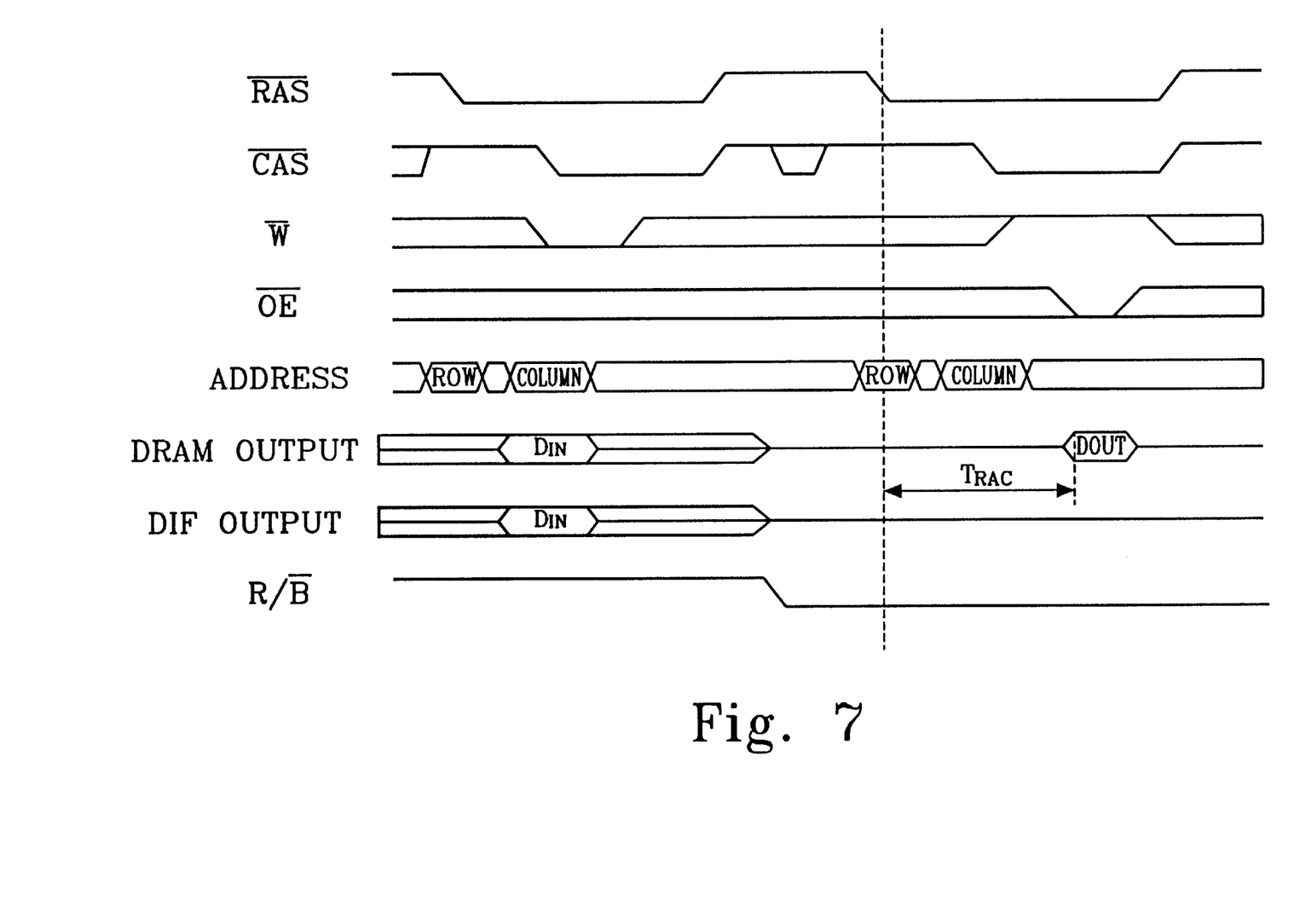
FIG. 7 is a timing chart of signals which are used to discriminate between DRAM and DIFM according to another embodiment of the present invention.

FIG. 7 illustrates other methods and systems for distinguishing between DRAMs and DIFMs. According to FIG. 7, data is written into a given address of the DRAM and DIFM and is then read after a predetermined time period. DIFMs can be distinguished between DRAMs based upon the differences in time which is required to write data into DRAMs and DIFMs. In particular, flash memory devices such as DIFM perform programming and erase operations using hot carrier or Fowler-Nordheim tunneling current. Thus, it generally takes longer to write data into flash memory devices than it does to write data into DRAMs.

Accordingly, as shown in FIG. 7, when reading data DOUT after a predetermined period of time $T_{RAC}$ after writing data $D_{IN}$ into a given memory cell, the DRAM returns the same data that was written in the previous write operation. In contrast, in a DIFM, the data write mode continues until R/$\overline{B}$ goes high. The DIFM does not output the same data that was written in a previous operation. Accordingly, a DRAM and a DIFM may be distinguished from one another. It will be understood that the methods and systems of FIG. 7 may be used to distinguish both F/P and EDO DRAMs from DIFM memories.

Accordingly, different memory types may be distinguished from one another, thereby allowing for improved system performance, since it is possible to supply each memory type with preferred operating signals and timings. When a system includes DRAM modules, its controller can provide control signals according to its operation mode. If new memory modules with new operation modes are developed, these modules can-also be distinguished from presently available modules based on differing outputs which are provided during a predetermined time period after an input signal is applied.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of distinguishing refreshed dynamic random access memory (DRAM) and nonvolatile memory from one another in a memory system containing refreshed DRAM and nonvolatile memory the method comprising the steps of:
    applying a refresh signal to the refreshed DRAM and to the nonvolatile memory; and
    detecting data from the refreshed DRAM and detecting absence of data from the nonvolatile memory during a predetermined time period after the refresh signal is applied.

2. A method according to claim 1 wherein the nonvolatile memory is a DRAM interfaced flash memory (DIFM).

3. A method according to claim 1 wherein the step of detecting absence of data from the nonvolatile memory during a predetermined time period after the refresh signal is applied comprises the step of:
    detecting a high impedance from the nonvolatile memory during the predetermined time period after the refresh signal is applied.

4. A method according to claim 1 wherein the detecting step is followed by the step of:
    controlling the plurality of memory types in the memory system differently based upon the differing outputs which are detected from the plurality of memory types during the predetermined time period after the input signal is applied.

5. A method according to claim 1 wherein the memory system comprises a memory module containing the plurality of different memory types.

6. A method according to claim 1 wherein the memory system comprises a plurality of memory modules, each of which contains a different memory type.

7. A method of distinguishing refreshed dynamic random access memory (DRAM) and nonvolatile memory from one another in a memory from one another in a memory system containing refreshed DRAM and nonvolatile memory, the method comprising the steps of:
    writing data into the refreshed DRAM and into the nonvolatile memory; and
    detecting the written data from the refreshed DRAM and detecting absence of the written data from the nonvolatile memory during a predetermined time period after the data is written.

8. A memory system comprising:
    a plurality of memory types;
    means for applying an input signal to the plurality of memory types;
    means for detecting differing outputs from the plurality of memory types during a predetermined time period after the input signal is applied; and
    means for controlling the plurality of memory types differently based upon the differing outputs which are detected from the plurality of memory types during the predetermined time period after the input signal is applied.

9. A memory system according to claim 10:
    wherein the plurality of memory types comprise extended data output (EDO) dynamic random access memories (DRAM) and fast page mode (F/P) DRAM;
    wherein the applying means comprises means for applying a column address signal to the EDO DRAM and to the F/P DRAM; and
    wherein the detecting means comprises means for detecting data from the EDO DRAM and detecting a high impedance from the F/P DRAM during a predetermined time period after the column address signal is applied.

10. A memory system comprising:
    a plurality of memory types including refreshed dynamic random access memory (DRAM) and nonvolatile memory;
    means for applying a refresh signal to the refreshed DRAM and to the nonvolatile memory; and
    means for detecting data from the refreshed DRAM and for detecting absence of data from the nonvolatile memory during a predetermined time period after the refresh signal is applied.

11. A memory system according to claim 10 wherein the nonvolatile memory is a DRAM interfaced flash memory (DIFM).

12. A memory system according to claim 10 wherein the detecting means comprises:

means for detecting a high impedance from the nonvolatile memory during the predetermined time period after the refresh signal is applied.

13. A memory system according to claim 8 wherein the plurality of memory types are contained in a memory module.

14. A memory system according to claim 8 wherein the plurality of memory types are contained in a plurality of memory modules, each of which contains a different memory type.

15. A memory system comprising:

a plurality of memory types including refreshed dynamic random access memory (DRAM) and nonvolatile memory;

means for writing data into the refreshed DRAM and into the nonvolatile memory; and means for detecting the written data from the refreshed DRAM and for detecting absence of the written data from the nonvolatile memory during a predetermined time period after the data is written.

16. A method of distinguishing a plurality of memory types including Dynamic Random Access Memory (DRAM) and non-DRAM from one another in a memory system containing the plurality of memory types, the method comprising the steps of:

applying an input signal to the memory system containing the plurality of memory types including DRAM and non-DRAM; and detecting differing outputs from the plurality of memory types including DRAM and non-DRAM during a predetermined time period after the input signal is applied.

17. A method according to claim 16 wherein the non-DRAM comprises nonvolatile memory.

18. A method according to claim 16 wherein the detecting step is followed by the step of:

controlling the plurality of memory types including DRAM and non-DRAM in the memory system differently based upon the differing outputs which are detected from the plurality of memory types including DRAM and non-DRAM during the predetermined time period after the input signal is applied.

19. A method according to claim 16 wherein the memory system comprises a memory module containing the plurality of different memory types including DRAM and non-DRAM.

20. A method according to claim 16 wherein the memory system comprises a plurality of memory modules, each of which contains a different memory type including DRAM and non-DRAM.

21. A memory system comprising:

a plurality of memory types including refreshed Dynamic Random Access Memory (DRAM) and non-DRAM;

means for applying an input signal to the plurality of memory types including DRAM and non-DRAM;

means for detecting differing outputs from the plurality of memory types including DRAM and non-DRAM during a predetermined time period after the input signal is applied; and means for controlling the plurality of memory types including DRAM and non-DRAM differently based upon the differing outputs which are detected from the plurality of memory types including DRAM and non-DRAM during the predetermined time period after the input signal is applied.

22. A memory system according to claim 21 wherein the non-DRAM comprises nonvolatile memory.

23. A memory system according to claim 21 wherein the plurality of memory types including DRAM and non-DRAM are contained in a memory module.

24. A memory system according to claim 21 wherein the plurality of memory types including DRAM and non-DRAM are contained in a plurality of memory modules, each of which contains a different memory type including DRAM and non-DRAM.

* * * * *

UNITED STATES PATENT AND TRADEMARK OFFICE
CERTIFICATE OF CORRECTION

PATENT NO.    :    6,012,122
DATED         :    January 4, 2000
INVENTOR(S)   :    Choi et al.

It is certified that error appears in the above-identified patent and that said Letters Patent is hereby corrected as shown below:

Column 6, line 21, please delete "from one another in a memory"

Signed and Sealed this

Thirty-first Day of October, 2000

Attest:

Q. TODD DICKINSON

*Attesting Officer*      *Director of Patents and Trademarks*